United States Patent
Reeder et al.

(10) Patent No.: US 7,268,059 B2
(45) Date of Patent: *Sep. 11, 2007

(54) METHODS FOR SECURING COMPONENTS OF SEMICONDUCTOR DEVICE ASSEMBLIES TO EACH OTHER WITH ADHESIVE MATERIALS THAT INCLUDE PRESSURE-SENSITIVE AND CURABLE COMPONENTS

(75) Inventors: W. Jeff Reeder, Boise, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 102 days.

This patent is subject to a terminal disclaimer.

(21) Appl. No.: 11/242,557

(22) Filed: Oct. 3, 2005

(65) Prior Publication Data

US 2006/0030073 A1 Feb. 9, 2006

Related U.S. Application Data

(60) Continuation of application No. 10/933,889, filed on Sep. 2, 2004, now Pat. No. 7,071,078, which is a continuation of application No. 10/408,528, filed on Apr. 7, 2003, now Pat. No. 6,864,153, which is a continuation of application No. 09/934,910, filed on Aug. 22, 2001, now Pat. No. 6,544,864, which is a division of application No. 09/574,759, filed on May 19, 2000, now Pat. No. 6,426,552.

(51) Int. Cl.
*H01L 21/30* (2006.01)
*H01L 21/465* (2006.01)

(52) U.S. Cl. .................. 438/455; 438/106; 257/E21; 257/499; 257/514

(58) Field of Classification Search .............. 438/455, 438/106, 48, 51, 55, 64, 112, 118, 123, 458, 438/611, 612, 617
See application file for complete search history.

(56) References Cited

U.S. PATENT DOCUMENTS

| 4,526,646 A | 7/1985 | Suzuki et al. |
| 4,543,659 A | 9/1985 | Ozaki |
| 4,557,860 A | 12/1985 | DiSalvo et al. |
| 4,604,230 A | 8/1986 | Goswami et al. |
| 4,664,739 A | 5/1987 | Aurichio |
| 4,687,693 A | 8/1987 | Sheyon et al. |
| 4,736,437 A | 4/1988 | Sacks et al. |
| 4,899,921 A | 2/1990 | Bendat et al. |

(Continued)

*Primary Examiner*—David Nhu
(74) *Attorney, Agent, or Firm*—TraskBritt, PC

(57) ABSTRACT

A method for securing a semiconductor device component to another element is provided. An adhesive material includes a pressure-sensitive component and a curable component is used to at least temporarily secure the semiconductor device component and the other element to each other. The pressure-sensitive component of the adhesive material temporarily secures the semiconductor device component and the other element to one another. When the semiconductor device component and the other element are properly aligned, the curable component of the adhesive material may be cured to more permanently secure them to one another. For example, when a thermoset material is used as the curable component, it may be cured by heating, such as at a temperature of lower than about 200° C. and as low as about 120° C. or less.

21 Claims, 3 Drawing Sheets

U.S. PATENT DOCUMENTS

| | | |
|---|---|---|
| 5,006,575 A | 4/1991 | Chan |
| 5,059,559 A | 10/1991 | Takahashi et al. |
| 5,113,565 A | 5/1992 | Cipolla et al. |
| 5,145,099 A | 9/1992 | Wood et al. |
| 5,238,174 A | 8/1993 | Ricketson et al. |
| 5,250,600 A | 10/1993 | Nguyen et al. |
| 5,288,698 A | 2/1994 | Banjo et al. |
| 5,304,842 A | 4/1994 | Farnworth et al. |
| 5,371,178 A | 12/1994 | Nguyen |
| 5,386,000 A | 1/1995 | Nguyen |
| 5,448,450 A | 9/1995 | Burns |
| 5,463,227 A | 10/1995 | Stern et al. |
| 5,471,310 A | 11/1995 | Spigarelli et al. |
| 5,488,082 A | 1/1996 | Dietz et al. |
| 5,489,637 A | 2/1996 | Nguyen et al. |
| 5,506,684 A | 4/1996 | Ota et al. |
| 5,516,023 A | 5/1996 | Kono |
| 5,516,026 A | 5/1996 | Ariye et al. |
| 5,548,160 A | 8/1996 | Corbett et al. |
| 5,612,403 A | 3/1997 | Nguyen et al. |
| 5,644,245 A | 7/1997 | Saitoh et al. |
| 5,804,631 A | 9/1998 | Mine et al. |
| 5,840,598 A | 11/1998 | Grigg et al. |
| 5,912,282 A | 6/1999 | Iyer et al. |
| 5,912,316 A | 6/1999 | Nguyen et al. |
| 5,964,979 A | 10/1999 | George et al. |
| 5,973,052 A | 10/1999 | Iyer et al. |
| 5,982,041 A | 11/1999 | Mitani et al. |
| 6,012,502 A | 1/2000 | VanNortwick et al. |
| 6,159,609 A | 12/2000 | Evers |
| 6,259,592 B1 | 7/2001 | Ono |
| 6,426,552 B1 | 7/2002 | Reeder et al. |
| 6,544,864 B2 | 4/2003 | Reeder et al. |
| 6,717,259 B2 | 4/2004 | Reeder et al. |
| 7,071,078 B2 * | 7/2006 | Reeder et al. ............... 438/455 |

* cited by examiner

METHODS FOR SECURING COMPONENTS OF SEMICONDUCTOR DEVICE ASSEMBLIES TO EACH OTHER WITH ADHESIVE MATERIALS THAT INCLUDE PRESSURE-SENSITIVE AND CURABLE COMPONENTS

CROSS-REFERENCE TO RELATED APPLICATIONS

This application is a continuation of application Ser. No. 10/933,889, filed Sep. 2, 2004, U.S. Pat. No. 7,071,078, which is a continuation of application Ser. No. 10/408,528, filed Apr. 7, 2003, now U.S. Pat. No. 6,864,153, issued Mar. 8, 2005, which is a continuation of application Ser. No. 09/934,910, filed Aug. 22, 2001, now U.S. Pat. No. 6,544,864, issued Apr. 8, 2003, which is a divisional of application Ser. No. 09/574,759, filed May 19, 2000, now U.S. Pat. No. 6,426,552, issued Jul. 30, 2002.

BACKGROUND OF THE INVENTION

1. Field of the Invention

The present invention relates to methods for using adhesive materials to secure two or more semiconductor device components to one another. Particularly, the present invention relates to the use of pressure-sensitive adhesive materials to secure semiconductor device components to each other. The present invention also relates to assemblies including semiconductor device components that are secured to one another with adhesive materials that include a pressure-sensitive component with sufficient bonding strength to at least temporarily secure the semiconductor device components to one another and a thermoset component for more permanently securing the semiconductor device components to one another.

2. State of the Art

Adhesives for Securing Components of Semiconductor Device Assemblies and Packages Adhesives have long been used to secure the various components of semiconductor device packages or assemblies to one another. Conventionally, thermoset adhesive materials have been used due to their bonding strengths when cured.

The most common conventional methods for attaching a semiconductor die to an interposer, lead frame, printed circuit board, tape, or other carrier include use of thermoset adhesive materials in the form of liquids, pastes, preformed structures, or on adhesive tapes or other elastomeric films. When cured, thermoset adhesive materials have high bond and cohesive strengths, which are desirable for securing the components of a semiconductor device assembly or package to one another so as to prevent movement of these components relative to one another and the possible damage that may be caused to intermediate conductive elements, such as wire bonds, or to the components themselves as a result of such movement.

The types of thermoset adhesive materials that have been used to secure the components of semiconductor device assemblies to one another include conventional thermoset adhesives, so-called "B-stage" epoxies, and so-called "snap cure" epoxies.

Conventional thermoset adhesives have very low bond strengths prior to being cured. Due to these poor bonding strengths, unless the semiconductor device components that are being secured to one another are physically held in place relative to one another, one or both of the semiconductor device components may shift position relative to the other, resulting in misalignment of the semiconductor device components. In addition, conventional thermoset adhesives that are used to secure semiconductor device components in assembled relationships are typically cured by exposure to relatively high temperatures for relatively long periods of time. The temperatures and exposure times that are required to cure many conventional thermoset adhesive materials may damage features on the semiconductor device components, such as by inducing thermal stresses therein, by causing thermal mismatching either before or after curing, by oxidizing features of the components, or otherwise. Moreover, once conventional thermoset adhesives have been cured, the assembled semiconductive device components cannot be removed from one another or repositioned relative to one another.

Snap cure epoxies are similar to conventional thermoset resins in that they have low bond strengths prior to curing and, once cured, the semiconductor device components secured thereby cannot be removed from each other or repositioned relative to each other. The cure times of snap cure epoxies are, however, very short (minutes or even seconds) relative to the cure times of conventional epoxies. While snap cure epoxies cure more quickly than conventional thermoset epoxies, the cure temperatures remain high (e.g., about 200° C. to about 225° C.) and may cause damage to features on the semiconductor device components.

B-stage epoxies are materials that become tacky after a first, partial cure, imparting these materials with pressure-sensitive adhesive characteristics that are sufficient to temporarily hold the semiconductor device components being secured together in place relative to one another until the B-stage epoxy has been fully cured. Partially cured B-stage epoxies also facilitate the removal of one semiconductor device component from another, as well as repositioning of the semiconductor device components relative to one another. The first, partial cure of B-stage epoxy is typically effected after application thereof to one of the semiconductor device components, but prior to assembling that component with another semiconductor device component. The presence of partially cured, tacky B-stage epoxy on an unassembled semiconductor device component is somewhat undesirable since material particles may adhere thereto, resulting in contamination and possibly in the failure of an assembly or package including the semiconductor device component.

Pressure-sensitive adhesives, which typically function at room temperature, have poor bonding strengths and low cohesive strengths when compared with the thermoset adhesive materials that have conventionally been used to secure the components of semiconductor device assemblies or packages to one another. Consequently, pressure-sensitive adhesive materials are typically not used to permanently secure the components of semiconductor device assemblies or packages to one another. Rather, pressure-sensitive adhesives have been used to temporarily secure the components of semiconductor device assemblies until a more permanent means of securing can be used, such as encapsulating the assemblies in a packaging material.

The art does not teach a method that includes use of an adhesive material to at least temporarily secure the components of a semiconductor device assembly or package to one another at ambient temperature and subsequently curing the adhesive material at a relatively low cure temperature for a short period of time. Nor does the art teach semiconductor device assemblies or packages including components secured to one another with such adhesive materials.

Hybrid Adhesive Materials

Recently, a new class of hybrid adhesive material has been developed. These hybrid adhesive materials have a pressure-sensitive component and a thermosetting component. Exemplary hybrid adhesives of this type are available from 3M as Structural Bonding Tape 9244, Structural Bonding Tape 9245, and Structural Bonding Tape 9246, each of which includes an acrylic pressure-sensitive component and an epoxy thermoset component.

At room temperature, due to their pressure-sensitive adhesive components, these hybrid adhesive materials function as conventional pressure-sensitive adhesives. The bond strengths of these hybrid adhesive materials at room temperature are sufficient to temporarily secure two objects to one another. A more permanent bond between the two objects may be formed by subjecting these hybrid adhesive materials to an increased temperature, which cures the thermoset adhesive components thereof.

While these hybrid materials have been used in place of rivets, spot welds, liquid adhesives, and other permanent fasteners that are used in structural applications for large-dimensional components or objects being fabricated, they have not been used to temporarily or permanently secure the components of semiconductor device assemblies or packages to one another.

SUMMARY OF THE INVENTION

The present invention includes a method for at least temporarily securing the components of a semiconductor device assembly or package to one another at room temperature with a hybrid adhesive material. A more permanent bond between the components may subsequently be formed by exposing at least the hybrid adhesive material to a relatively low increased temperature for a relatively short period of time.

A hybrid adhesive material that includes at least a pressure-sensitive component and a thermoset component may be used to effect the method of the present invention. As an example, the pressure-sensitive component of a hybrid adhesive useful in the method and assemblies of the present invention may comprise an acrylic adhesive material, while the thermosetting component may comprise an epoxy thermosetting adhesive material. Examples of such hybrid adhesive materials include those available from 3M as Structural Bonding Tape 9244, Structural Bonding Tape 9245, and Structural Bonding Tape 9246, each of which includes an acrylic pressure-sensitive component and an epoxy thermoset component. At room temperature, due to their pressure-sensitive components, these hybrid adhesive materials function as conventional pressure-sensitive adhesives. At increased temperatures as low as about 120° C. or less, the thermoset components of these hybrid adhesive materials cure, or set, providing a more permanent bond between adhered objects.

In use according to the present invention, the hybrid adhesive material is disposed between components of a semiconductor device assembly or package that have been aligned and that are to be secured to one another. The pressure-sensitive component of the hybrid adhesive material facilitates the formation of at least a temporary bond between the semiconductor device components at an ambient temperature, such as room temperature.

Once the semiconductor device components have been assembled and at least temporarily secured to one another with the hybrid adhesive material, the hybrid adhesive material may be subjected to an increased cure temperature for a predetermined period of time so as to cure the thermoset component of the hybrid adhesive material and to provide a more permanent, more secure bond between the semiconductor device components. Preferably, the cure temperature is sufficiently low and cure time sufficiently short so as to not substantially damage or induce thermal stresses on any of the assembled semiconductor device components. For example, the 3M hybrid adhesive materials may be cured, or set, by exposing same to a temperature of about 120° C. for about 95 minutes. Of course, higher cure temperatures may alternatively be used for shorter durations to cure the 3M hybrid adhesive materials. When cured, these hybrid adhesive materials provide a bond of sufficient strength between the assembled semiconductor device components.

The present invention also includes assemblies of semiconductor device components that include a hybrid adhesive material between at least a portion of two or more of the semiconductor device components, as well as semiconductor device packages including such assemblies.

Other features and advantages of the present invention will become apparent to those of skill in the art through consideration of the ensuing description, the accompanying drawings, and the appended claims.

DETAILED DESCRIPTION OF THE INVENTION

Figure 1:
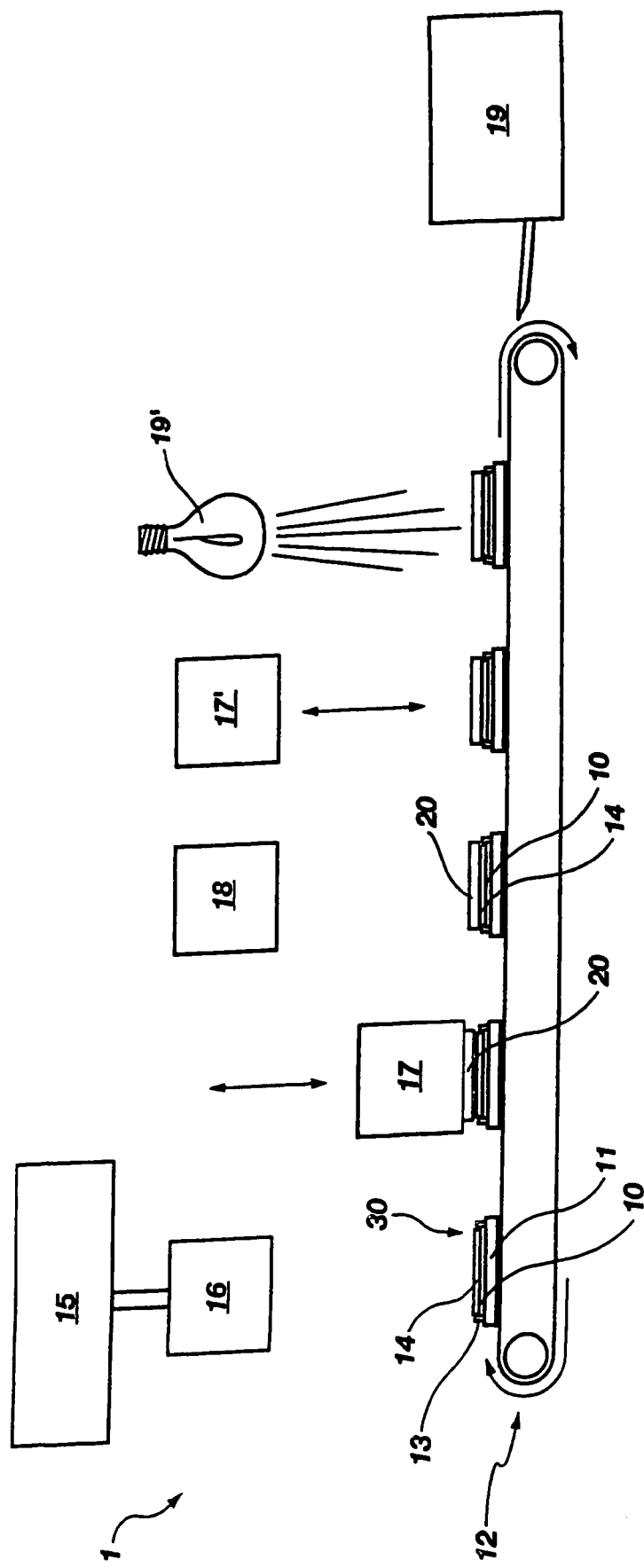
FIG. 1 is a schematic representation of a die attach apparatus that may be used to secure components of a semiconductor device assembly or package to one another in accordance with teachings of the present invention.

A method for securing the components of a semiconductor device assembly or package to one another employing a die attach system 1 known in the art is illustrated in FIG. 1. A first component 10 of a semiconductor device assembly 30 is moved along a conveyor 12 of die attach system 1 and may be supported by or secured to a support 11 associated with conveyor 12. Although FIG. 1 illustrates die attach system 1 as including supports 11 carried on a conveyor belt, conveyor 12 may alternatively comprise a sprocket-drive apparatus for engaging sprocket, or indexing, holes formed in first component 10 or another known type of conveyance apparatus. Conveyor 12 moves first component 10 to a position where a dispenser 16 of die attach system 1 may apply a quantity of a hybrid adhesive material 14 from an adhesive source 15 to first component 10, preferably at about room temperature. Die attach system 1 also includes a placement apparatus 17 that positions a second component 20 of semiconductor device assembly 30 relative to first component 10 and effects the assembly of second component 20 and first component 10, with hybrid adhesive material 14 at least temporarily securing first and second components 10 and 20, respectively, to each other.

First component 10 may comprise, for example, a carrier, such as a leadframe, a circuit board, a semiconductor die, a flexible circuit, or an assembly of semiconductor device components. Second component 20 may also include a semiconductor die or another component useful in semiconductor device assemblies, such as a heat sink or a lead frame.

Hybrid adhesive material 14 includes a pressure-sensitive component and a thermoset component. The pressure-sensitive component of hybrid adhesive material 14 may include an acrylic adhesive material, while the thermoset component may include an epoxy thermoset adhesive material. Exemplary materials that may be employed as hybrid adhesive material 14 include the adhesives available from 3M as Structural Bonding Tape 9244, Structural Bonding Tape 9245, and Structural Bonding Tape 9246. At room temperature, due to their pressure-sensitive components, these hybrid adhesive materials function as conventional pressure-sensitive adhesives. At increased temperatures, the thermoset components of these hybrid adhesive materials cure, or set. Preferably, the thermoset component of hybrid adhesive material 14 sets by exposure to a temperature of less than about 200° C. for a duration of less than about 100 minutes. The thermoset component may cure when exposed to a temperature of about 120° C. or lower.

Hybrid adhesive material 14 may be applied to first component 10 by known processes, such as by spraying hybrid adhesive material 14 onto at least selected regions of first component 10, by spreading hybrid adhesive material 14 across a surface of first component 10 (e.g., with a doctor blade), by securing a strip coated with hybrid adhesive material 14 to first component 10, by metered-dispensing a quantity of hybrid adhesive material 14 onto first component 10, by extrusion of hybrid adhesive material 14 onto first component 10, or by using a contact applicator (e.g., a roller or stamp). Of course, adhesive source 15 and dispenser 16 of die attach system 1 include known components that are configured to apply hybrid adhesive material 14 to first component 10 in the desired manner.

Placement apparatus 17 is configured to pick second component 20 from a first location where a plurality of second components 20 is located, such as a carrier associated with die attach system 1 and to position and place second component 20 in contact with hybrid adhesive material 14 that has been disposed on or applied to first component 10. When second component 20 is placed in contact with first component 10, placement apparatus 17 is preferably also configured to apply sufficient pressure (force) to second component 20 to facilitate adherence thereof to first component 10 by way of at least the pressure-sensitive component of hybrid adhesive material 14. A die attach apparatus useful in effecting the method of the present invention may include a placement apparatus 17 of a known type, such as a pick-and-place apparatus including a vacuum collet or quill configured and fitted to handle semiconductor dice and other small, fragile objects.

After first component 10 and second component 20 have been aligned by placement apparatus 17 or at least temporarily secured to one another with hybrid adhesive material 14, assembly 30 may be checked to ensure that first and second components 10 and 20, respectively, are properly aligned. Accordingly, die attach system 1 may also include a diagnostic component 18, such as a so-called "machine vision system" (e.g., a "pattern recognition system" (PRS)), of a known type. For example, and without limitation, such systems are available from Cognex Corporation of Natick, Mass., as the Cognex BGA Inspection Package™, the SMD Placement Guidance Package™, the MVS-8000™ product family, and the Checkpoint® product line, the latter employed in combination with Cognex PatMax™ software. It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

If first component 10 and second component 20 are misaligned, one of components 10, 20 may be realigned with the other component 20, 10. If first component 10 and second component 20 have been temporarily secured to one another with hybrid adhesive material 14, one of components 10, 20 may be removed from the other, then realigned with and readhered to the other component 20, 10. As an example, placement apparatus 17 may be used to effect such removal, realignment, and readherence. Alternatively, die attach system 1 may include a repositioning element 17' configured similarly to placement apparatus 17 (e.g., a pick-and-place apparatus) located down-line from placement apparatus 17. Of course, when repositioning is effected, first component 10 must be secured in place prior to removing second component 20 therefrom. Accordingly, die attach system 1 preferably also includes a brace 13 of a known type (e.g., a vacuum collet beneath support 11 or a rigid member extending over at least a portion of first component 10) associated with support 11 or conveyor 12 and configured to securely retain first component 10 to support 11 or conveyor 12.

Once components 10 and 20 have been properly aligned or realigned, the thermoset component of hybrid adhesive material 14 may be cured by exposing same to an increased temperature. Preferably, the cure temperature and the time duration for which components 10 and 20 are exposed to the cure temperature will not substantially damage or induce thermal stresses on any of the assembled semiconductor device components. When one of the 3M Structural Bonding Tapes (9244, 9245, or 9246) is employed as hybrid adhesive material 14, the following TABLE illustrates the durations for which hybrid adhesive material 14 should be exposed to certain, exemplary set temperatures to substantially cure at least the thermoset components thereof:

TABLE

| Cure temperature | Cure Time |
|---|---|
| 250° F. (121° C.) | 95 min. |
| 275° F. (135° C.) | 42 min. |

TABLE-continued

| Cure temperature | Cure Time |
|---|---|
| 300° F. (149° C.) | 20 min. |
| 325° F. (162° C.) | 10 min. |
| 350° F. (176° C.) | 6 min. |

Hybrid adhesive material 14 may be exposed to an increased temperature using known apparatus and methods, such as by placing semiconductor device assembly 30 in an oven 19 heated to the desired temperature, by heating a support 11 upon which first component 10 is carried to the desired temperature, or by subjecting the semiconductor device assembly to directed radiation in the form of, for example, heat lamps 19'.

Of course, second components 20 may alternatively be carried along conveyor 12 to have hybrid adhesive material 14 applied thereto, while first components 10 are positioned upon and assembled with second components 20 by way of placement apparatus 17.

Assemblies of semiconductor device components that include a hybrid adhesive material 14 between at least a portion of two or more of the semiconductor device components 10 and 20, as well as semiconductor device packages including such assemblies, are also within the scope of the present invention. Exemplary assemblies incorporating teachings of the present invention are illustrated in FIGS. 2-6.

The use of hybrid adhesive material 14 is particularly useful for assembling any two or more semiconductor device components prior to electrically connecting the semiconductor device components to one another.

Figure 2:
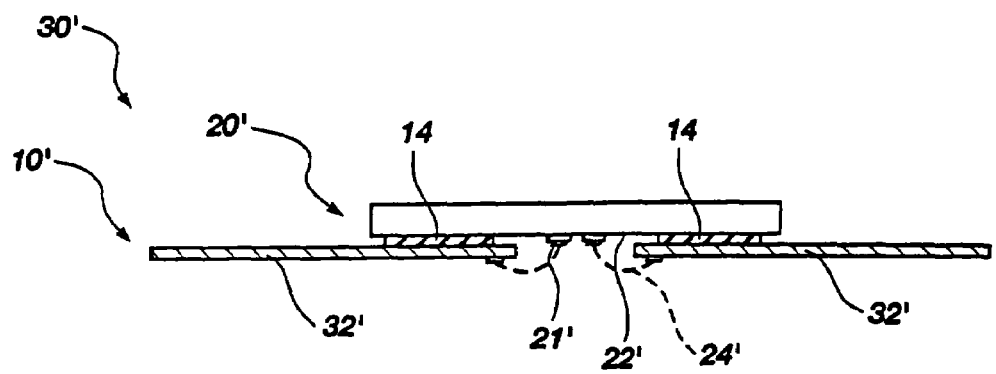
FIG. 2 is a cross-sectional representation of a package including a semiconductor die and leads secured thereto by way of a hybrid adhesive material in accordance with teachings of the present invention.

FIG. 2 illustrates a first embodiment of an assembly 30' according to the present invention, which includes a semiconductor die 20' and a lead-over-chip ("LOC") type lead frame 10' with leads 32' that are connectable to corresponding bond pads 21' on an active surface 22' of semiconductor die 20', such as by wire bonds 24' or thermocompression bonds. Leads 32' are secured to active surface 22' with hybrid adhesive material 14 that has been applied directly to leads 32'.

Figure 3:
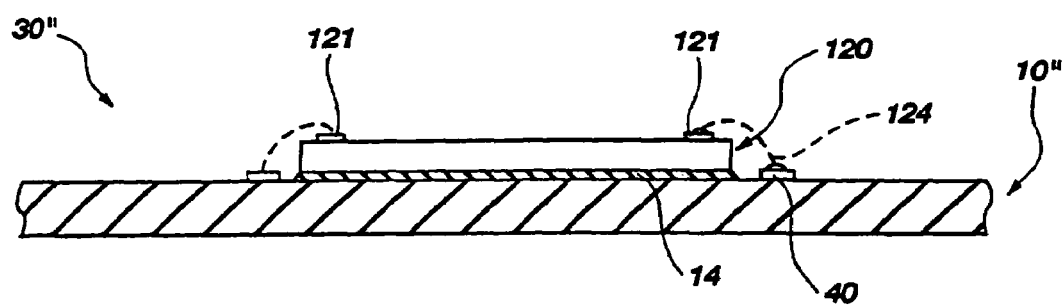
FIG. 3 is a cross-sectional representation of an assembly including a semiconductor die secured to a circuit board with a hybrid adhesive material in accordance with teachings of the present invention.

A second embodiment of an assembly 30" incorporating teachings of the present invention, depicted in FIG. 3, includes a semiconductor die 120 secured to a carrier substrate in the form of a circuit board 10" with a quantity of hybrid adhesive material 14. Bond pads 121 of semiconductor die 120 may be connected to corresponding contact pads 40, or terminals, of circuit board 10" by way of wire bonds 124 or otherwise, as known in the art.

Figure 4:
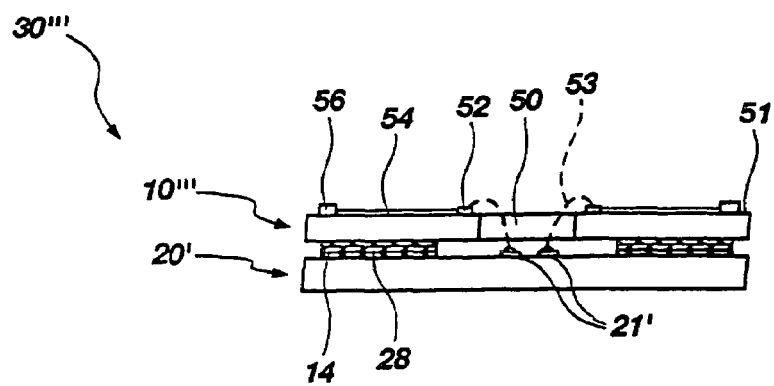
FIG. 4 is a cross-sectional representation of an assembly including a semiconductor die secured to an interposer with a hybrid adhesive material in accordance with teachings of the present invention.

Referring now to FIG. 4, a third embodiment of an assembly 30''' of the present invention is shown. Assembly 30''' includes a semiconductor die 20' secured to an interposer 10''', such as may be used to form a chip-scale package, by way of strips 28 of polymeric film that are coated with hybrid adhesive material 14. As depicted, interposer 10''' includes a slot 50 formed therethrough and a surface 51 with first contact pads 52 located adjacent slot 50 and second contact pads 56 that are arranged on surface 51 and that each communicate with a corresponding first contact pad 52 by way of a conductive trace 54 that is carried by interposer 10'''. Bond pads 21' of semiconductor die 20' may be electrically connected to corresponding first contact pads 52 of interposer 10''' by way of wire bonds 53 that extend through slot 50, or otherwise, as known in the art.

Figure 5:
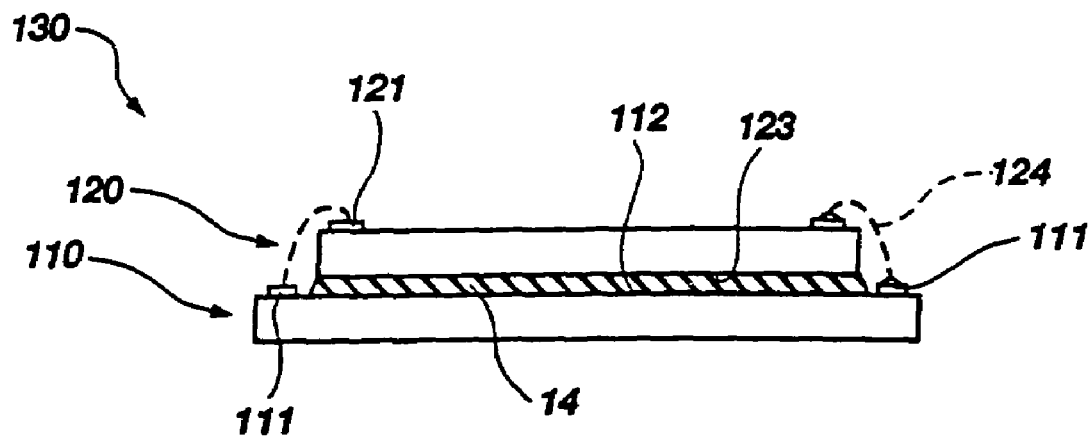
FIG. 5 is a cross-sectional representation of a stacked, multi-chip module including stacked semiconductor dice that are secured to one another with a hybrid adhesive material in accordance with teachings of the present invention.

FIG. 5 illustrates an embodiment of an assembly 130 comprising a stacked, multi-chip module that includes stacked semiconductor dice 110, 120 that are secured to one another with a quantity of hybrid adhesive material 14 disposed between an active surface 112 of semiconductor die 110 and a back side 123 of semiconductor die 120. Bond pads 111 of semiconductor die 110 may be connected to corresponding bond pads 121 of semiconductor die 120 by way of wire bonds 124, or otherwise, as known in the art.

Once a semiconductor device and a carrier have been assembled and secured to one another with hybrid adhesive material 14, as illustrated in FIGS. 2-5, known processes may be used to form electrical connections between the semiconductor device and the carrier.

Figure 6:
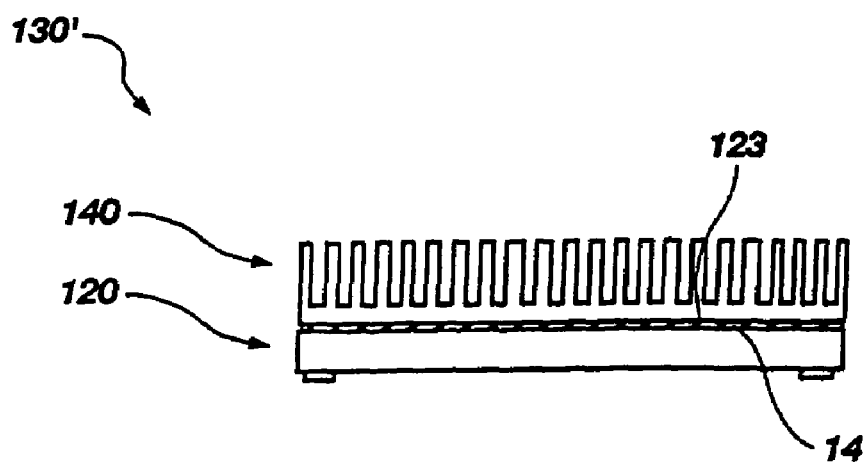
FIG. 6 is a cross-sectional representation of an assembly including a semiconductor die and a heat sink that are secured to one another with a hybrid adhesive material in accordance with teachings of the present invention.

As shown in FIG. 6, a fifth embodiment of an assembly 130' according to the present invention includes a semiconductor die 120 and a heat sink 140 positioned on a back side 123 of semiconductor die 120 so as to draw heat therefrom. Heat sink 140 is secured to semiconductor die 120 with a quantity of hybrid adhesive material 14 disposed between heat sink 140 and back side 123 of semiconductor die 120.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method for securing at least one semiconductor device component and another element to one another, comprising:

applying adhesive material comprising a pressure sensitive component and a curable component to at least a portion of a surface of at least one of the semiconductor device component and the another element;

temporarily securing the semiconductor device component and the another element to one another with the adhesive material; and curing the curable component of the adhesive material.

2. The method of claim 1, wherein temporarily securing comprises pressing at least one of the at least one semiconductor device component and the another element toward the other of the another element and the at least one semiconductor device component with the adhesive material therebetween.

3. The method of claim 1, wherein, in temporarily securing, the pressure sensitive component of the adhesive material temporarily secures the at least one semiconductor device component and the another element to one another.

4. The method of claim 1, wherein temporarily securing comprises temporarily securing at least two semiconductor device components to one another.

5. The method of claim 1, wherein applying comprises at least one of spraying the adhesive material, spreading the adhesive material, metered-dispensing of the adhesive material, extruding the adhesive material, contact applying the adhesive material, and positioning a structure coated with the adhesive material.

6. The method of claim 5, wherein spraying comprises atomizing the adhesive material.

7. The method of claim 1, wherein curing the curable component of the adhesive material comprises heating at least the adhesive material.

8. The method of claim 7, wherein heating comprises heating at least the adhesive material to a temperature of less than about 200° C.

9. The method of claim 7, wherein heating comprises heating at least the adhesive material to a temperature of about 120° C.

10. The method of claim 1, further comprising:
repositioning the at least one semiconductor device component and the another element relative to one another before curing the curable component of the adhesive material.

11. A method for securing at least one semiconductor device component and another element to one another, comprising:
applying an adhesive material comprising a pressure sensitive component and a curable component to at least one of the at least one semiconductor device component and the another element;
positioning the at least one semiconductor device component and the another element adjacent to one another with adhesive material positioned therebetween to at least temporarily secure the at least one semiconductor device component and the another element to one another; and
altering a state of the curable component of the adhesive material to permanently secure the at least one semiconductor device component and the another element to one another.

12. The method of claim 11, wherein, during positioning, the pressure sensitive component of the adhesive material temporarily secures the at least one semiconductor device component and the another element to one another.

13. The method of claim 11, wherein, during altering, the curable component of the adhesive material permanently secures the at least one semiconductor device component and the another element to one another.

14. The method of claim 11, wherein positioning comprises pressing at least one of the at least one semiconductor device component and the another element toward the other of the another element and the at least one semiconductor device component.

15. The method of claim 11, wherein positioning comprises positioning at least two semiconductor device components relative to one another.

16. The method of claim 11, wherein applying comprises at least one of spraying the adhesive material, spreading the adhesive material, metered-dispensing of the adhesive material, extruding the adhesive material, contact applying the adhesive material, and positioning a structure coated with the adhesive material.

17. The method of claim 16, wherein spraying comprises atomizing the adhesive material.

18. The method of claim 11, wherein altering comprises heating at least the curable component of the adhesive material.

19. The method of claim 18, wherein heating comprises heating at least the curable component to a temperature of less than about 200° C.

20. The method of claim 18, wherein heating comprises heating at least the thermoset component of the adhesive material to a temperature of about 120° C.

21. The method of claim 11, further comprising:
repositioning the at least two semiconductor device components relative to one another before altering the state of the curable component.

* * * * *